US011469239B1

(12) United States Patent
Desai et al.

(10) Patent No.: US 11,469,239 B1
(45) Date of Patent: Oct. 11, 2022

(54) STATIC RANDOM-ACCESS MEMORY (SRAM) ARRAY CIRCUITS INCLUDING BILATERAL WELL TAP CELLS WITH REDUCED WIDTH FOLDED FINGER STRUCTURE

(71) Applicant: QUALCOMM Incorporated, San Diego, CA (US)

(72) Inventors: Channappa Desai, Haveri (IN); Sunil Sharma, Bangalore (IN); Anne Srikanth, Bangalore (IN); Pradeep Jayadev Kodlipet, Bangalore (IN); Yandong Gao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/217,067

(22) Filed: Mar. 30, 2021

(51) Int. Cl.
*H01L 27/11* (2006.01)
*H01L 27/092* (2006.01)
*H01L 23/482* (2006.01)

(52) U.S. Cl.
CPC ...... *H01L 27/1104* (2013.01); *H01L 23/4824* (2013.01); *H01L 27/0924* (2013.01); *H01L 27/0928* (2013.01)

(58) Field of Classification Search
CPC ............. H01L 27/1104; H01L 23/4824; H01L 27/0924; H01L 27/0928
See application file for complete search history.

(56) References Cited

U.S. PATENT DOCUMENTS

| 11,031,073 | B2* | 6/2021 | Liaw | H01L 29/7827 |
| 2018/0350819 | A1* | 12/2018 | Choi | H01L 23/53257 |
| 2019/0096474 | A1* | 3/2019 | Pao | G11C 11/412 |
| 2020/0251476 | A1 | 8/2020 | Chang et al. | |
| 2020/0395476 | A1* | 12/2020 | Su | H01L 21/02381 |

OTHER PUBLICATIONS

International Search Report and Written Opinion for International Patent Application No. PCT/US2022/070576, dated May 31, 2022, 14 pages.

\* cited by examiner

*Primary Examiner* — Karen Kusumakar
*Assistant Examiner* — Adam S Bowen
(74) *Attorney, Agent, or Firm* — Qualcomm Incorporated

(57) ABSTRACT

An SRAM array circuit in which a horizontal N-well of a well tap cell in a first row separated from a horizontal N-well of a well tap cell in a second row by a P-type substrate region is disclosed. The well tap cells include a bilateral P-type well tap disposed in the P-type substrate region between the horizontal N-wells in the first and second rows providing ground voltage to the P-type substrate on both sides of a column of well tap cells in the SRAM array circuit, rather than one P-type well tap for each side. Well tap cells without a vertical N-well reduces width, which corresponds to a reduction in width of the SRAM array circuit. The bilateral P-type well tap in a P-type implant region may include a plurality of folded fingers providing the ground voltage to the P-type substrate.

20 Claims, 11 Drawing Sheets

STATIC RANDOM-ACCESS MEMORY (SRAM) ARRAY CIRCUITS INCLUDING BILATERAL WELL TAP CELLS WITH REDUCED WIDTH FOLDED FINGER STRUCTURE

BACKGROUND

I. Field of the Disclosure

The field of the disclosure relates generally to integrated circuits (ICs) and more specifically to arrays of memory devices in an IC.

II. Background

Consumer electronics require a high level of performance at a low cost. Much of the performance is provided by integrated circuits (ICs). One way to lower cost in an IC is to reduce the area of the IC without reducing its performance. A large percentage of the area in many ICs is occupied by memory circuits. Therefore, a reduction in the size of memory circuits can be a significant contribution to a reduction in size and cost of an IC. Static random-access memory (SRAM) circuits are frequently used memory circuits due to their fast access time and long life. SRAM circuits includes several transistors formed in a semiconductor substrate. The transistors are arranged in efficient patterns in memory bit cells and the memory bit cells are arranged in two-dimensional (2D) arrays on the semiconductor substrate. Each row of the SRAM array includes N-type regions and P-type regions of the semiconductor substrate. Proper operation of the SRAM circuits requires those regions to be at certain voltage levels (e.g., supply voltage, VDD, and ground voltage, VSS), so the N-type and P-type regions are electrically coupled to a corresponding voltage at the array periphery. Therefore, the memory bit cells close to the array periphery have a low resistance connection to VDD/VSS but the VDD/VSS path resistance increases with distance from the array periphery.

Where there is a high resistance path through the semiconductor substrate from a memory bit cell to the nearest VDD/VSS connection, a voltage anomaly, such as a voltage supply spike or a single-event upset (e.g., high energy particle), can cause the voltage in the N-type region or P-type region to become higher than VDD or lower than VSS. Such voltage anomalies can trigger parasitic transistors in the semiconductor substrate structure to be conductive, resulting in a condition known as latch-up. During latch-up, a low resistance path is created between VDD and VSS and the SRAM circuit will not return to normal without cycling power in the SRAM circuit. The current flow resulting from a latch-up condition can destroy the SRAM circuit. Latch-up can be avoided by keeping a path resistance from VDD or VSS to an SRAM circuit lower than a threshold resistance. Thus, a solution is needed for SRAM circuits at a long distance from the array periphery, where the path resistance through the substrate to VDD/VSS is high. To prevent the SRAM circuits that are farther from the array periphery (e.g., in the middle of the SRAM array) from being vulnerable to latch-up, well tap cells are inserted in each row such that a distance to a VDD/VSS source is reduced. A well tap cell provides VDD/VSS via a low resistance path to the semiconductor substrate in SRAM cells in the middle of an SRAM array. The number of well taps is minimized because of the width a well tap cell adds to each row of the SRAM array.

SUMMARY OF THE DISCLOSURE

Aspects disclosed herein include static random-access memory (SRAM) array circuits including bilateral well tap cells with reduced width folded finger structure. Well tap cells inserted into each row of an SRAM array circuit provide power and ground connections to a substrate to reduce latch-up in SRAM bit cell circuits. The well tap cells are disposed in a column between columns of the SRAM bit cell circuits. The SRAM array circuit includes a P-type substrate with a horizontal N-well disposed in each row. In existing SRAM arrays, the column of well tap cells includes a vertical N-well and N-type well taps located where the vertical N-well intersects with the horizontal N-wells. The vertical N-well electrically couples the horizontal N-wells in the respective rows but divides the P-type substrate vertically, decoupling the P-type substrate on a first side of the well tap cells from the P-type substrate on a second side of the well tap cells. Thus, the well tap cells include a P-type well tap on each side of the vertical N-well to provide ground connections to the first and second sides of the P-type substrate.

In an exemplary aspect, a horizontal N-well of a well tap cell in a first row of an SRAM array circuit is separated from a horizontal N-well of a well tap cell in a second row by a P-type substrate region. In the absence of a vertical N-well, the well tap cell includes a bilateral P-type well tap disposed in the P-type substrate region between the horizontal N-well in the first row and the horizontal N-well in the second row. The bilateral P-type well tap provides ground voltage to the P-type substrate on both sides of a column of well tap cells in parallel, rather than separate P-type well taps for each side of the SRAM array circuit. Without a vertical N-well, a width of the well tap cells is reduced, which corresponds to a reduction in width of the SRAM array circuit. The bilateral P-type well tap may include a plurality of folded fingers providing the ground voltage to the P-type substrate in parallel. The column of well tap cells may also include a P-type implant region including the P-type well taps for each row of the SRAM array circuit and an N-type implant region including the N-type well taps for each row of the SRAM array circuit. An SRAM array circuit including exemplary well tap cells with bilateral P-type well taps has reduced width, which lowers cost without a change in performance.

In an exemplary aspect, an SRAM array circuit is disclosed. The SRAM array circuit comprises a substrate; a plurality of rows of SRAM bit cell circuits disposed on the substrate, each of the plurality of rows extending in a first axis direction; and a plurality of columns of the SRAM bit cell circuits, the plurality of columns extending in a second axis direction orthogonal to the first axis direction. The SRAM array circuit further comprises a column of well tap cells disposed between a first column of the plurality of columns and a second column of the plurality of columns, the column of well tap cells comprising a well tap cell disposed in each row of the plurality of rows. The substrate comprises a P-type substrate, and the well tap cell in each row comprises an N-well in the P-type substrate, the N-well extending in the first axis direction. The N-well of the well tap cell in a first row of the plurality of rows is separated from the N-well of the well tap cell in a second row of the plurality of rows by the P-type substrate. A P-type well tap is disposed in the P-type substrate between the N-well of the well tap cell in the first row and the N-well of the well tap cell in the second row and provides ground voltage to the SRAM bit cell circuits on a first side of the column of well tap cells and to the SRAM bit cell circuits on a second side of the column of well tap cells.

In another exemplary aspect, an IC comprising an SRAM array circuit is disclosed. The SRAM array circuit comprises a substrate; a plurality of rows of SRAM bit cell circuits disposed on the substrate, each of the plurality of rows extending in a first axis direction; and a plurality of columns of the SRAM bit cell circuits, the plurality of columns extending in a second axis direction orthogonal to the first axis direction. The SRAM array circuit comprises a column of well tap cells disposed between a first column of the plurality of columns and a second column of the plurality of columns, the column of well tap cells comprising a well tap cell disposed in each row of the plurality of rows. The substrate comprises a P-type substrate and the well tap cell in each row comprises an N-well in the P-type substrate, the N-well extending in the first axis direction. The N-well of the well tap cell in a first row of the plurality of rows is separated from the N-well of the well tap cell in a second row of the plurality of rows by the P-type substrate and a P-type well tap is disposed in the P-type substrate between the N-well of the well tap cell in the first row and the N-well of the well tap cell in the second row and provides ground voltage to the SRAM bit cell circuits on a first side of the column of well tap cells and to the SRAM bit cell circuits on a second side of the column of well tap cells.

DETAILED DESCRIPTION

Figure 1:
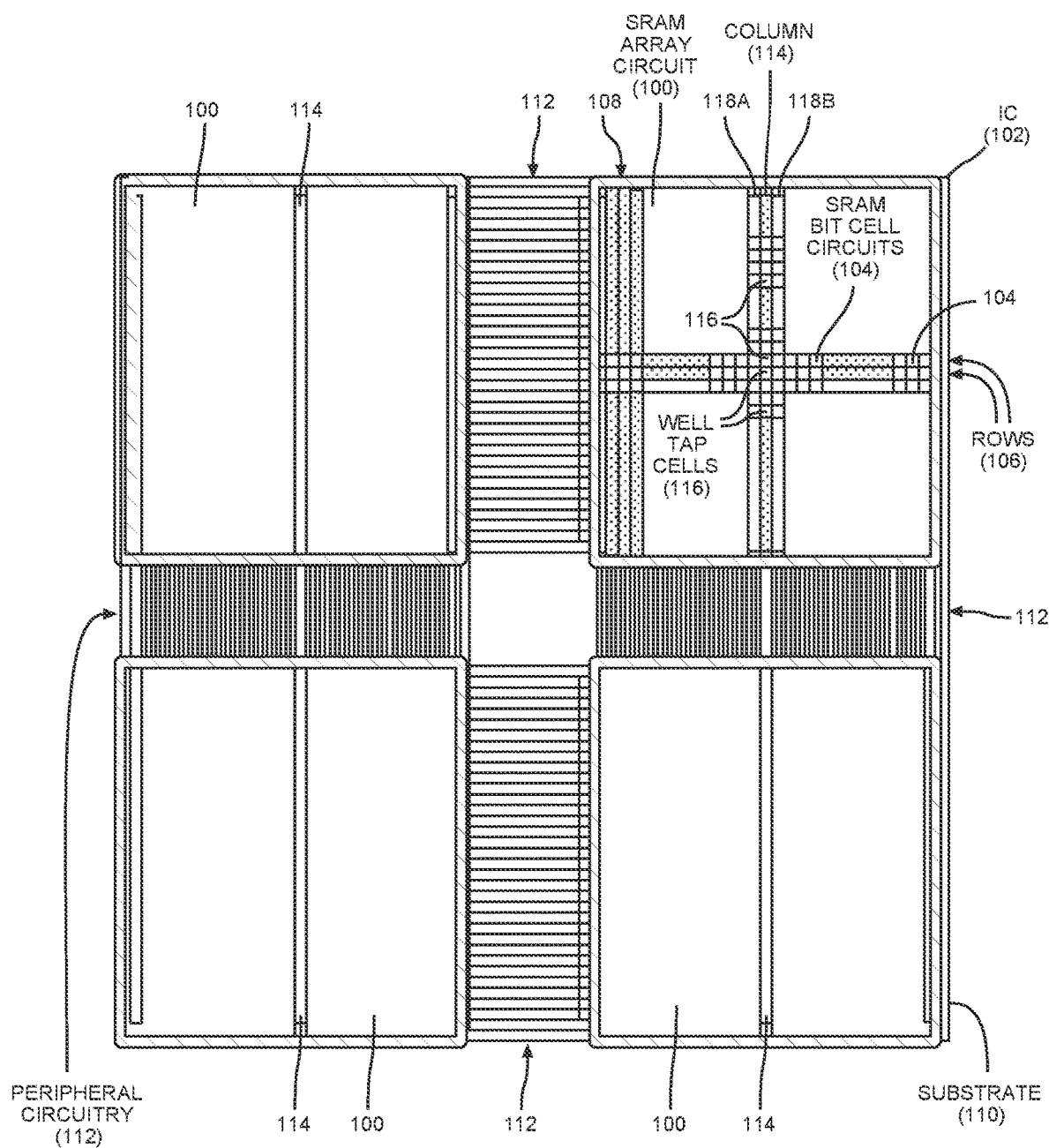
FIG. 1 is an illustration of a top view of static random-access memory (SRAM) array circuits in a two-bank array architecture configuration in which a column of well tap cells is included in each SRAM array circuit to reduce latch-up.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include static random-access memory (SRAM) array circuits including bilateral well tap cells with reduced width folded finger structure. Well tap cells inserted into each row of an SRAM array circuit provide power and ground connections to a substrate to reduce latch-up in SRAM bit cell circuits. The well tap cells are disposed in a column between columns of the SRAM bit cell circuits. The SRAM array circuit includes a P-type substrate with a horizontal N-well disposed in each row. In existing SRAM arrays, the column of well tap cells includes a vertical N-well and N-type well taps located where the vertical N-well intersects with the horizontal N-wells. The vertical N-well electrically couples the horizontal N-wells in the respective rows but divides the P-type substrate vertically, decoupling the P-type substrate on a first side of the well tap cells from the P-type substrate on a second side of the well tap cells. Thus, the well tap cells include a P-type well tap on each side of the vertical N-well to provide ground connections to the first and second sides of the P-type substrate.

In an exemplary aspect, a horizontal N-well of a well tap cell in a first row of an SRAM array circuit is separated from a horizontal N-well of a well tap cell in a second row by a P-type substrate region. In the absence of a vertical N-well, the well tap cell includes a bilateral P-type well tap disposed in the P-type substrate region between the horizontal N-well in the first row and the horizontal N-well in the second row. The bilateral P-type well tap provides ground voltage to the P-type substrate on both sides of a column of well tap cells in parallel, rather than separate P-type well taps for each side of the SRAM array circuit. Without a vertical N-well, a width of the well tap cells is reduced, which corresponds to a reduction in width of the SRAM array circuit. The bilateral P-type well tap may include a plurality of folded fingers providing the ground voltage to the P-type substrate in parallel. The column of well tap cells may also include a P-type implant region including the P-type well taps for each row of the SRAM array circuit and an N-type implant region including the N-type well taps for each row of the SRAM array circuit. An SRAM array circuit including exemplary well tap cells with bilateral P-type well taps has reduced width, which lowers cost without a change in performance.

Latch-up is a condition in an integrated circuit created by a parasitic transistor in an IC substrate when voltage levels fluctuate and a ground or supply voltage connection to a substrate has a high resistance path. A latch-up can create a short circuit between the power supply and ground voltage rails of a field-effect transistor (FET) circuit. The short circuit can result in error conditions and possibly a high current that can damage the IC. A large SRAM array circuit can be vulnerable to latch-up due to a high resistance path between a voltage source at a periphery of the SRAM array circuit, especially in SRAM bit cell circuits in the middle of a row a long distance from the periphery.

FIG. 1 is an illustration of a top view of SRAM array circuits 100 in an IC 102. The SRAM array circuits 100 include SRAM bit cell circuits 104 disposed in rows 106 and columns 108. Digital data can be written into, stored in, and read back from each of the SRAM bit cell circuits 104. The SRAM bit cell circuits 104 are formed in a substrate 110 of the IC 102. Peripheral circuitry 112 couples the substrate 110 to a supply voltage VDD and a ground voltage VSS for operation of the SRAM bit cell circuits 104. N-type regions (not shown) of the substrate 110, which are doped with pentavalent impurities and have electrons as the majority charge carriers, are coupled to VDD by the peripheral circuitry 112. P-type regions of the substrate 110, which are doped with trivalent impurities and have holes as the majority charge carriers, are coupled to VSS by the peripheral circuitry 112.

In addition, a column 114 of well tap cells 116 is included in each of the SRAM array circuits 100 to provide the supply voltage VDD and the ground voltage VSS directly to the substrate 110 in the SRAM bit cell circuits 104 at the middle of the rows 106. The well tap cells 116 provide the supply voltage VDD and ground voltage VSS to the SRAM bit cell circuits 104 via a lower resistance than a path from the peripheral circuitry 112 through the substrate 110. The column 114 is disposed between a first column 118A of the SRAM bit cell circuits 104 and a second column 118B. The SRAM bit cell circuits 104 may each include from 5 to 12 or more transistors (e.g., field effect transistors (FETs)). The benefits of well tap cells are independent of the specific design of the SRAM bit cell circuits. Thus, details of the SRAM bit cell circuits 104 are beyond the scope of the present application and are not provided herein.

Figure 2:
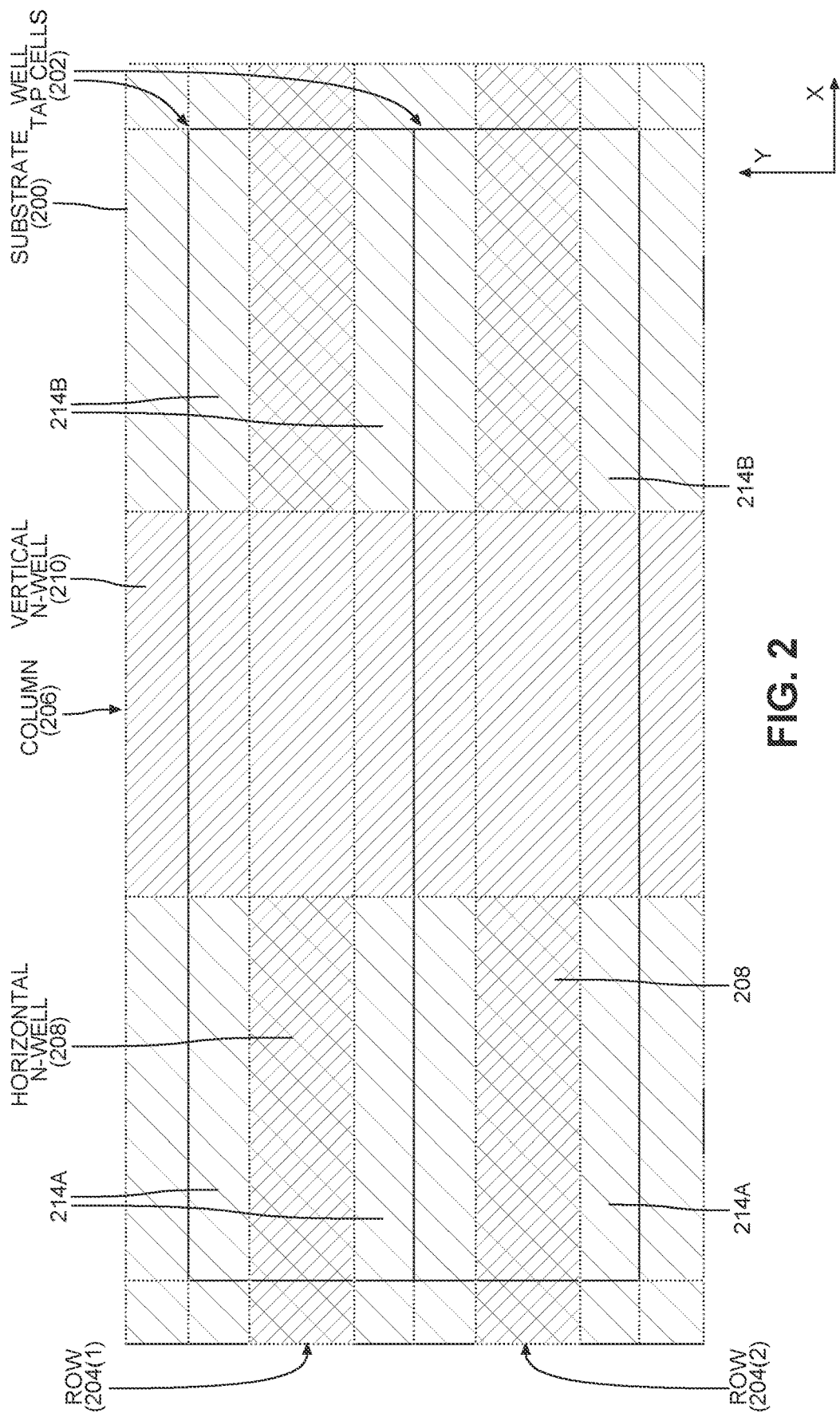
FIG. 2 is an illustration of a top view of substrate regions in well tap cells in an SRAM array circuit in which a vertical N-well divides regions of a P-type substrate into a first side and a second side.
Figure 3:
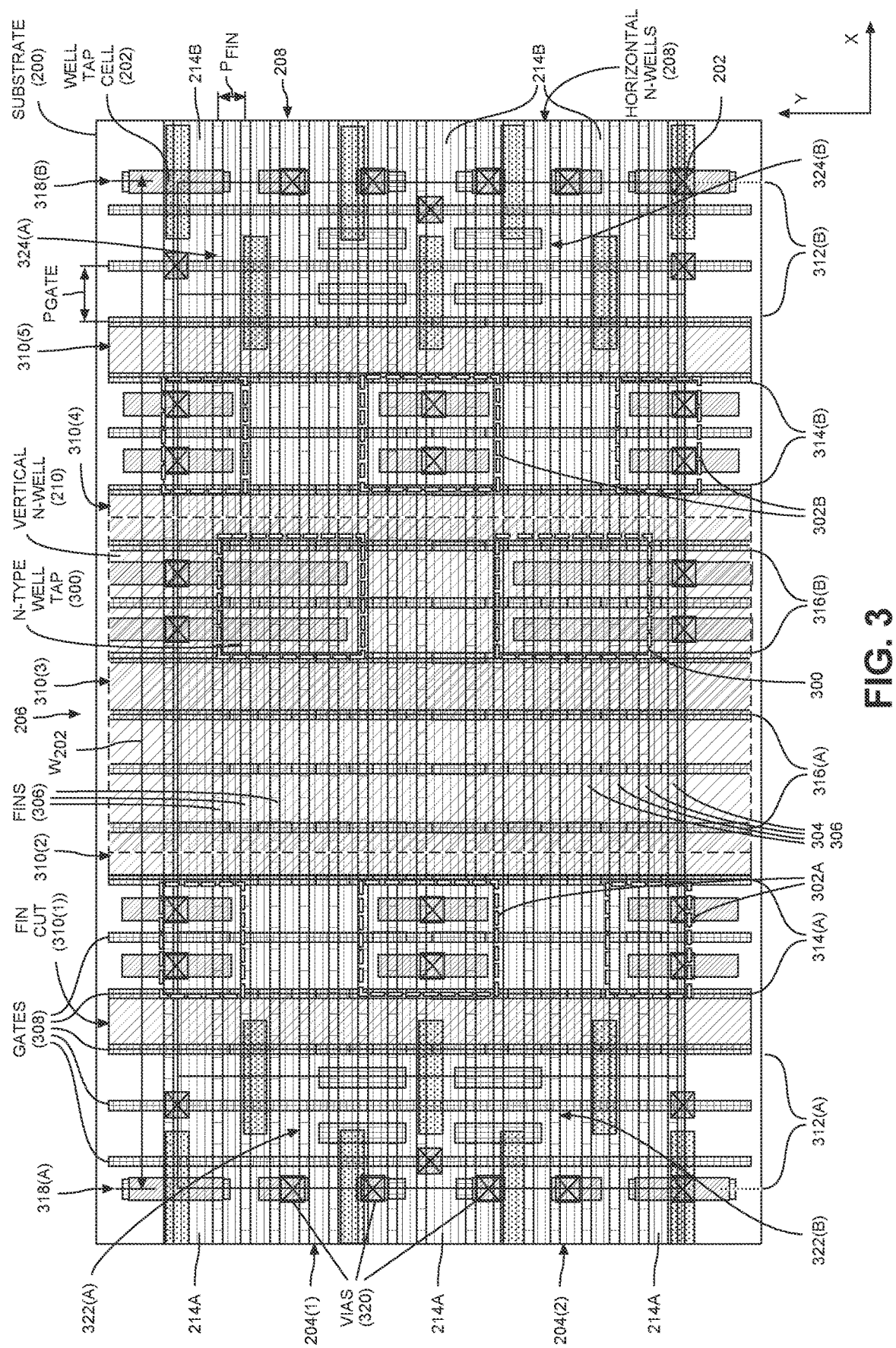
FIG. 3 is an illustration of a top view of the well tap cells in FIG. 2 including circuit layers and showing a P-type well taps on each side of the vertical N-well in each row of the SRAM array circuit to provide ground voltage to the P-type substrate.

Details of examples of well tap circuits 116 are presented herein. FIGS. 2-3 are illustrations of a conventional example of the well tap circuits 116. The example in FIGS. 2-3 is presented for purposes of comparison to the exemplary aspects illustrated FIGS. 4-10.

FIG. 2 is an illustration of a top view of a substrate 200 (also "P-type substrate 200") in which well tap cells 202 are formed, as shown further in FIG. 3. The substrate 200 and well tap cells 202 correspond to the substrate 110 and the well tap cells 116, respectively, in the SRAM array circuit 102 in FIG. 1. FIG. 2 shows two of the well tap cells 202, one in each of rows 204(1) and 204(2) (collectively rows 204) in a column 206 corresponding to the column 114 in FIG. 1. The two well tap cells 202 include horizontal N-wells 208 extending horizontally (i.e., in the X-axis direction) in each of the rows 204 and a vertical N-well 210 (i.e., extending in the Y-axis direction) across the rows 204 in the column 206. The vertical N-well 210 couples to both of the horizontal N-wells 208 in the rows 204 in a form that may be known as an "N-well bend". The vertical N-well 210 divides a P-type substrate 200 in the well tap cells 202 into first P-type substrate regions 214A on a first side of the vertical N-well 210 and second P-type substrate regions 214B on a second side of the vertical N-well 210. The first P-type substrate region 214A between the horizontal N-wells 208 in FIG. 2 is electrically decoupled from the second P-type substrate region 214B between the horizontal N-wells 208 such that a voltage directly coupled to the first P-type substrate region 214A is not coupled by a low-resistance path to the second P-type substrate region 214B.

FIG. 3 is an illustration of a top view of the well tap cells 202 in the two rows 204 and in the column 206 in FIG. 2. Features of FIG. 2 that are also shown in FIG. 3 have the same labels in FIG. 3 as in FIG. 2. The well tap cells 202 each include an N-type well tap 300 in each of the rows 204 to supply the supply voltage VDD to the horizontal N-well 208 and the vertical N-well 210. The well tap cells 202 in each of the rows 204 also includes two (2) P-type well taps 302A-302B to supply the ground voltage VSS to the first and second P-type substrate regions 214A and 214B. The well tap cells 202 have only one N-type well tap 300 because the horizontal N-wells 208 extend in both directions of the rows 204. In this regard, with the well tap cells 202 employed as the well tap cells 116 in the SRAM array circuit 100 in FIG. 1, the horizontal N-wells 208 extend through, and provide the supply voltage VDD to, the first and second columns 118A and 118B (and additional columns) of SRAM bit cell circuits 104. In addition, the vertical N-well 210 overlaps or intersects the horizontal N-well 208 in each row 204 such that the vertical N-well 210 is electrically coupled to each of the horizontal N-wells 208.

However, the first and second P-type substrate regions 214A and 214B are electrically separated from each other due to the vertical N-well 210 bisecting the substrate 200 in the Y-axis direction. Thus, the first P-type well tap 302A provides the ground voltage VSS to the first P-type substrate region 214A and the second P-type well tap 302B separately provides the ground voltage VSS to the second P-type substrate region 214B.

FIG. 3 illustrates additional features of the well tap cells 202 formed on the substrate 200 in FIG. 2. The well tap cells 202 include active regions 304 formed on the substrate 200. The active regions 304 extend parallel to the X-axis direction (e.g., horizontal in FIG. 3) in the rows 204. The active regions 304 include fins 306 which are spaced apart in the Y-axis direction at a fin pitch $P_{306}$. FETs (not shown) in the SRAM bit cell circuits 104 in FIG. 1 are formed where the fins 306 extend through the SRAM array circuits 100. Thus, FIG. 3 also includes gates 308 disposed above the fins 306. The gates 308 extend parallel to the Y-axis direction and are spaced apart from each other in the X-axis direction at regular intervals according to a gate pitch $P_{308}$.

The fins 306 do not extend continuously across the well tap cells 202. Rather, fin cuts 310(1)-310(5) (referred to collectively as fin cuts 310($x$)) are regions in which the fins 306 are removed from the substrate 200 such that the remaining fins 306 on either side of one of the fin cuts 310($x$) are electrically isolated from each other. Thus, the fin cuts 310($x$) divide the well tap cells 202 into sections 312(A), 312(B), 314(A), 314(B), 316(A), and 316(B) extending in the Y-axis direction, as described below.

The sections 312(A) and 312(B) are on opposite sides of the well tap cells 202 in the X-axis direction. The section 312(A) is between a column 318(A) of vias 320 and the fin cut 310(1). The section 312(A) includes a first bit cell termination 322(A) and a second bit cell termination 324(A) in the rows 204. The section 312(B) is between a column 318(B) of the vias 320 and the fin cut 310(5). The section 312(B) includes a first bit cell termination 322(B) and a second bit cell termination 324(B). The sections 312(A) and 312(B) may also be referred to as bit cell termination regions 312(A) and 312(B). The conventional example of well tap cells 202 shown in FIG. 3 extends horizontally from the column 318(A) to the column 318(B) for a total width $W_{202}$ equal to eighteen (18) times the gate pitch $P_{GATE}$.

Section 314(A) is between the fin cut 310(1) and the fin cut 310(2). Section 314(B) is between the fin cut 310(4) and the fin cut 310(5). The sections 314(A) and 314(B) include implanted P-type dopant materials (e.g., boron, aluminum, and/or gallium) and, therefore, are also referred to as first P-type implant region 314(A) and second P-type implant region 314(B). The first P-type well tap 302A is formed in the overlap of the first P-type implant region 314(A) and the P-type substrate 200 between the horizontal N-wells 208. The second P-type well tap 302B is formed in the overlap of the second P-type implant region 314(B) and the P-type substrate 200 between the horizontal N-wells 208.

The section 316(A) is on the vertical N-well 210 between the fin cut 310(2) and the fin cut 310(3), and the sections 316(B) is on the vertical N-well 210 between the fin cut 310(3) and the fin cut 310(4). Thus, the section 316(A) and the section 316(B) are on opposite sides of the fin cut 310(3). The N-type well tap 300 is formed in each of the rows 204 at an overlap of the vertical N-well 210 and the section 316(B).

The vertical N-well 210 in FIG. 3 provides electrical coupling between the horizontal N-wells 208, which is beneficial for voltage distribution among the N-wells 208, but resistivity of the vertical N-well 210 reduces such benefit. The vertical N-well 208 and the fin cuts 310(x) associated therewith, increases the width $W_{202}$ in the X-axis direction of the well tap cells 202 and also increase width of the SRAM array circuits 100 in FIG. 1. In addition, due to the vertical N-well 210 separating the first and second P-type substrate regions 214A and 214B from each other, both of the P-type well taps 302A-302B are needed in each row.

Figure 4:
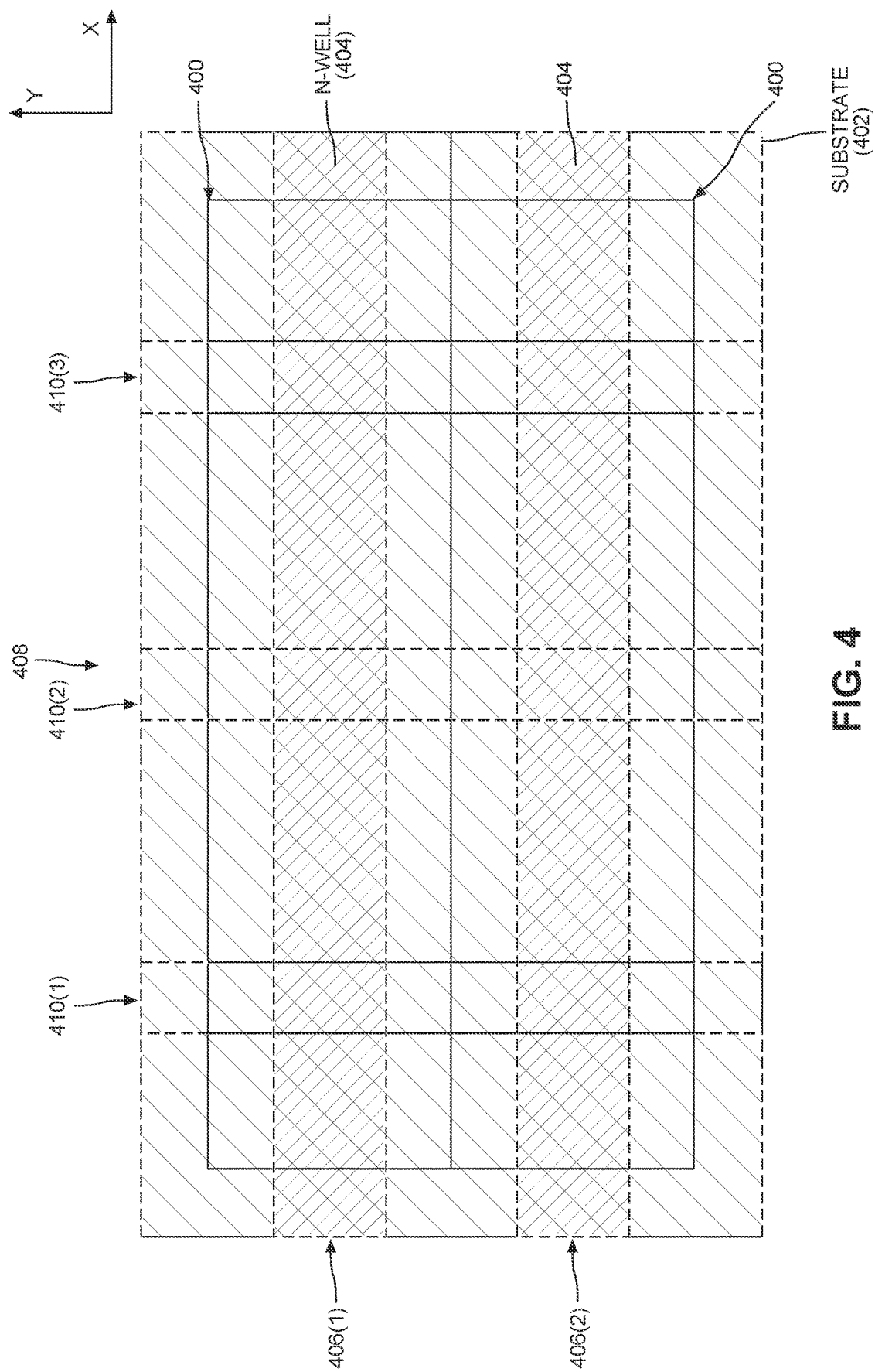
FIG. 4 is an illustration of a top view of substrate regions in exemplary well tap cells, including a P-type substrate extending uninterrupted between N-wells in each row.

Exemplary aspects of a well tap cell 400 are illustrated in FIG. 4, which corresponds in a level of detail to FIG. 2. The well tap cells 400 are formed on a substrate 402 (also "P-type substrate 402") and each well tap cell 400 includes an N-well 404 in the P-type substrate 402, where the N-well 404 extends in the X-axis direction. The N-well 404 in a first row 406(1) is separated from the N-well 404 in a second row 406(2) by the P-type substrate 402, which is partially within a first well tap cell 400 in the first row 406(1) and partially within a second well tap cell 400 in the second row 406(2). The well tap cells 400 are arranged in a column 408 with a plurality of rows 406(1)-406(x) (only 406(1) and 406(2) are shown). The N-well 404 in the well tap cell 400 in each of the rows 406(1)-406(x) extends in the X-axis direction on both sides of the column 408 to the SRAM bit cell circuits 104 shown in FIG. 1. The number "x" is a number of rows in the SRAM array circuit 100 in FIG. 1, where each row includes transistors for the SRAM bit cell circuits 104 formed in the N-well 404 and the P-type substrate 402.

The P-type substrate 402 extends uninterrupted in the X-axis direction for a width $W_{400}$ because the well tap cell 400 does not include a vertical N-well (i.e., extending in the Y-axis direction) across the rows 406(1) and 406(2) in the column 408. The well tap cells 400 can be employed in the well tap cells 116 in FIG. 1 and the description below of some aspects of the description of well tap cells 400 refer to an implementation in the SRAM array circuits 100 including the SRAM bit cell circuits 104 in FIG. 1. FIG. 4 also indicates locations of fin cuts 410(1)-410(3).

Figure 5:
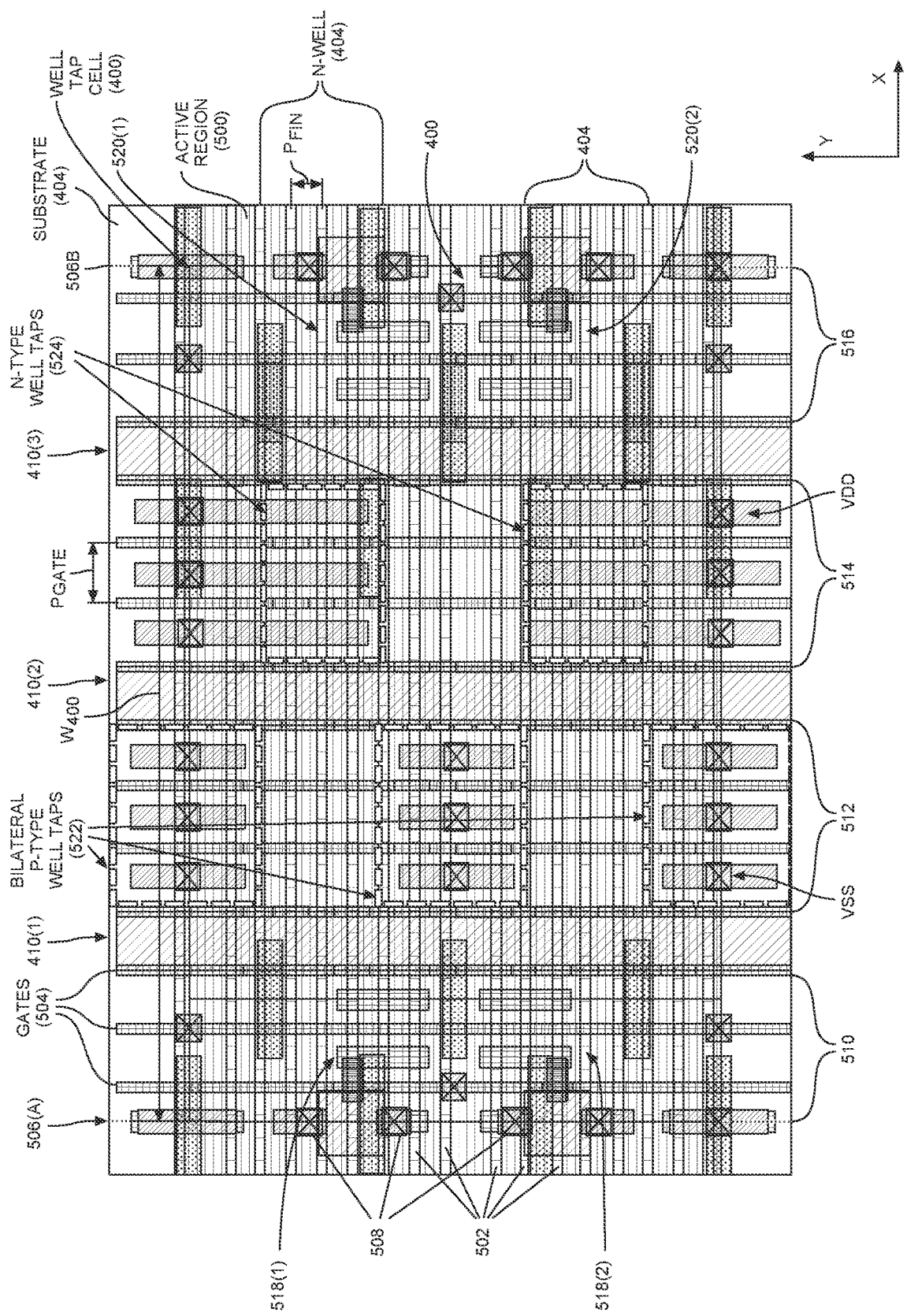
FIG. 5 is an illustration of a top view of the substrate in FIG. 4 including circuit layers of the exemplary well tap cells in which a bilateral P-type well tap disposed between horizontal N-wells provides ground voltage to the P-type substrate on both sides of the column of well tap cells in parallel.

FIG. 5 illustrates further exemplary aspects of the well tap cells 400 with a level of detail corresponding to FIG. 3. Features of FIG. 4 that are also in FIG. 5 have the same labels in FIG. 5 as in FIG. 4. The well tap cells 400 include active regions 500. The active regions 500 include fins 502 in the P-type substrate 402 and the N-wells 404 but may instead include planar regions the P-type substrate 402 and the N-wells 404. The fins 502 extend parallel to the X-axis direction and are spaced apart from each other at intervals according to a fin pitch $P_{FIN}$. Gates 504 are disposed above the fins 502 and extend parallel to each other in the Y-axis direction. The gates 504 are spaced apart in the X-axis direction and are separated from each other at intervals according to a gate pitch $P_{GATE}$. The gates 504 are, for example, polysilicon gates as employed in fin FETs.

The well tap cells 400 extend a width $W_{400}$ from a first column 506A of vias 508 to a second column 506B of vias 508. In the absence of a vertical N-well, like the vertical N-well 210 in FIG. 2, and the fin cuts associated with the vertical N-well 210, the width $W_{400}$ is equal to fourteen (14) times the gate pitch $P_{GATE}$, which is narrower than the width $W_{202}$ of the well tap cells 202 in FIGS. 2 and 3. Such reduction in width realized by the well tap cell 400 translates to a corresponding reduction in width of the SRAM array circuits 100.

The fins 502 in the well tap cells 400 are divided into sections 510, 512, 514 and 516 by fin cuts 410(1)-410(3). The sections 510, 512, 514 and 516 and the fin cuts 410(1)-410(3) extend longitudinally parallel to each other in the Y-axis direction orthogonal to the fins 502. The section 510 is between the first column 506A of vias 508 and the fin cut 410(1). The section 510 is also referred to as bit cell termination section 510 because the section 510 includes circuit structures 518(1) and 518(2) in the rows 406(1) and 406(2) for end termination of the SRAM bit cell circuits 104 in FIG. 1 on a first side of the column 408. The section 516 is between the fin cut 410(3) and the second column 506B of vias 508. The section 516 is also bit cell termination section 516 because section 516 includes circuit structures 520(1) and 520(2) in the rows 406(1) and 406(2) for end termination of the SRAM bit cell circuits 104 in FIG. 1 on a second side of the column 408.

Section 512 of well tap cells 400 is between the fin cut 410(1) and the fin cut 410(2). The section 512 is also a P-type implant region 512 implanted with P-type dopant material. A bilateral P-type well tap 522 is disposed in the P-type implant region 512 in the P-type substrate 402 between the N-well 404 in the first row 406(1) and the N-well 404 in the second row 406(2), partially within the well tap cells 400 in each of the rows 406(1) and 406(2). Specifically, the bilateral P-type well tap 522 is located where the P-type implant region 512 and the P-type substrate 402 overlap or intersect. The P-type substrate 402 being implanted with P-type dopant increases conductivity of the P-type well tap 522, which provides a low resistance connection to the P-type substrate 402 to which the ground voltage VSS may be provided to avoid latch-up. Since the P-type substrate 402 extends uninterrupted to both sides of the column 408 of the well tap cells 400, the bilateral P-type well tap 522 provides the ground voltage VSS to the P-type substrate 402 in the SRAM bit cell circuits 104 on a first side of the well tap cell 400 and to the P-type substrate 402 in the SRAM bit cell circuits 104 on a second side of the well tap cell 400 in parallel. Thus, one bilateral P-type well tap 522 is employed in the well tap circuits 400 for each row instead of the first and second P-type well taps 302A and 302B in the well tap cells 202 in FIGS. 2 and 3. As noted above, the P-type well tap 522 is located within the P-type substrate 402 located partially within the well tap cell 400 in the first row 406(1) and partially within the well tap cell 400 in the second row 406(2). Similarly, another P-type well tap 522 is located partially within the well tap cell 400 in the second row 406(2) and partially within the well tap cell 400 in a third row 406(3), and so on, such that the column 408 includes a P-type well tap cell 522 corresponding to the rows 406(1)-406(x−1).

Section 514 of the well tap cells 400 is also referred to as an N-type implant region 514 because the section 514 of the column 408 (extending in the Y-axis direction) is implanted with N-type dopant material (e.g., phosphorous, arsenic, and/or antimony) between the fin cut 410(2) and the fin cut 410(3). An N-type well tap 524 is disposed in the N-type implant region 514 in the N-well 404 in the first row 406(1) and another N-type well tap 524 is disposed in the N-type implant region 514 in the N-well 404 in the second row 406(2). Specifically, the N-type well tap 524 is located where the N-type implant region 514 and the N-well 404 overlap or intersect. In this regard, the N-well 404 is provided the supply voltage VDD at a low resistance to avoid latch-up. The N-well 404 extends into the SRAM array circuit 100 on both sides of the column 408 and provides the supply voltage VDD to the SRAM bit cell circuits 104 on a first side of the well tap cell 400 in parallel with the SRAM bit cell circuits 104 on a second side of the well tap cell 400.

The N-wells 408 in the respective rows 406(1) and 406(2) are electrically coupled to each other in one or more metal layers (not shown), which provide a lower resistance path between the N-wells 404 than the vertical N-well 210 in FIG. 2 provides. Additionally, the well tap cells 400 in FIG. 5 are narrower in width (i.e., 14 times the gate pitch $P_{GATE}$) than the well tap cells 202 in FIG. 3 (i.e., 18 times the gate pitch $P_{GATE}$) because the well tap cells 400 do not include the vertical N-well 210. A reduction in width $W_{400}$ of the well tap cells 400 compared to the width $W_{202}$ of the well tap cells 202 reduces width of the SRAM array circuits 100 without a reduction in function and performance, which will reduce cost of an IC containing the SRAM array circuits 100.

Figure 6:
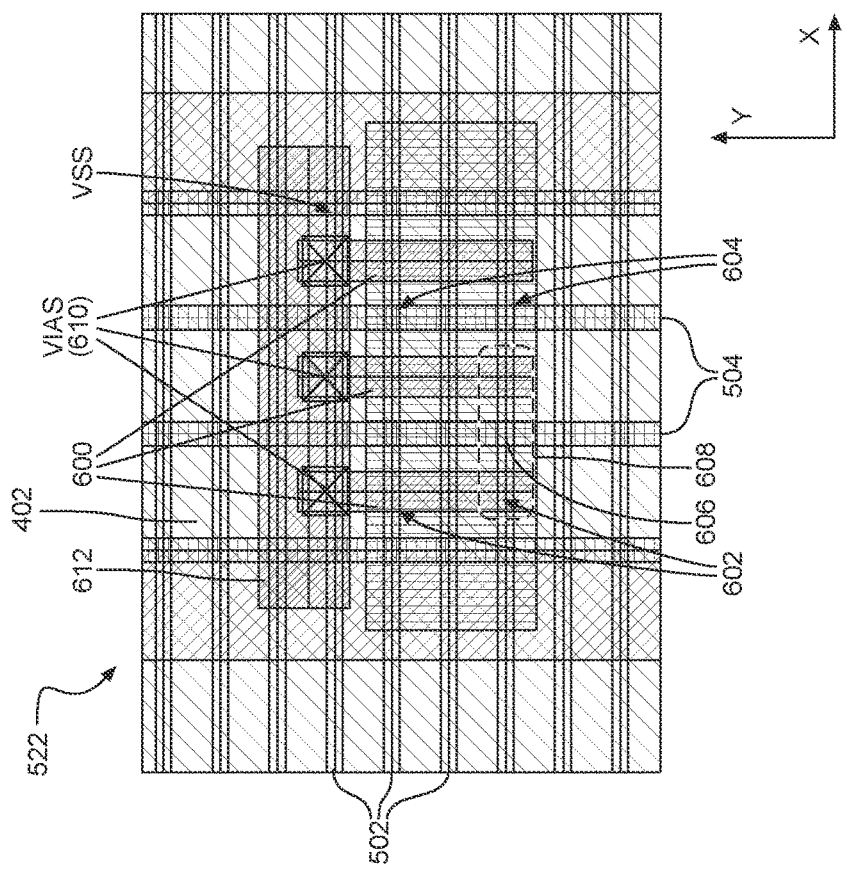
FIG. 6 is an illustration of a top view of a P-type well tap with three folded fingers coupled together to provide ground voltage to a P-type substrate in parallel.

FIG. 6 is a top view illustration of one of the bilateral P-type well taps 522, which includes three folded fingers 600 coupled together to provide the ground voltage VSS to the P-type substrate 402 in parallel. FIG. 6 shows the fins 502 of FIG. 5 extending in the X-axis direction. The folded fingers 600 are metal or another conductive material disposed on source/drain regions 602 of a plurality of the fins 502 and extend in the Y-axis direction. The folded fingers 600 are electrically coupled to the source/drain regions 602 of the plurality of fins 502. The source/drain regions 602 are portions of the fins 502 between the gates 504. Gate regions 604 of the plurality of fins 502 are disposed under the gates 504 in the P-type well taps 522. The gate regions 604 are formed of a non-conductive material 606 where polysilicon material of the gates 502 above the gate portions 604 is removed to prevent activation of the gate regions 604 of the fins 502. In this example, the folded fingers 600 are each coupled to two (2) of the source/drain regions 602. A P-tie 608 is formed where one of the folded fingers 600 couples to the source/drain regions 602 on both sides of a gate region 604 to couple the P-type substrate 402 to the ground voltage VSS. Thus, the bilateral P-type well tap 522 in FIG. 6 includes four (4) P-ties 608. Vias 610 couple the folded fingers 600 to a metal rail 612 that receives the ground voltage VSS. In this manner, the folded fingers 600 couple the ground voltage VSS to the P-type substrate 402 in parallel through the P-ties 608.

Figure 7:
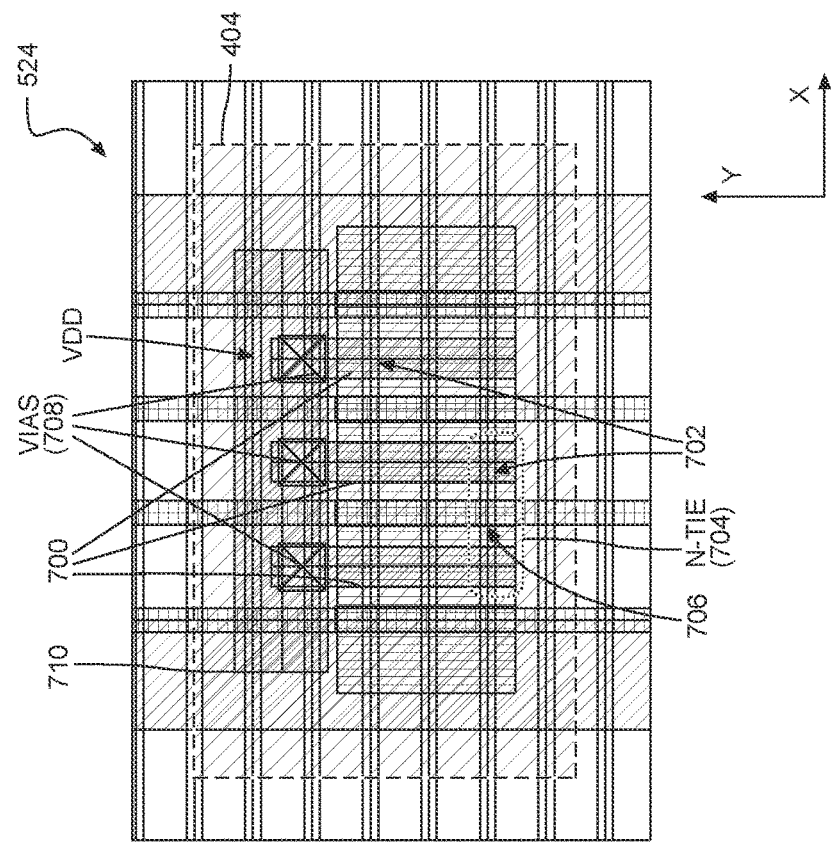
FIG. 7 is an illustration of a top view of an N-type well tap region with three folded fingers coupled together to provide a supply voltage to an N-well in parallel.

FIG. 7 is a top view illustration of the N-type well tap 524, which includes three folded fingers 700 coupled together to provide the supply voltage VDD to the N-well 404 in parallel. The folded fingers 700 are each coupled to a source/drain region 702 of the fins 502 and an N-tie 704 is formed where the folded fingers 700 are coupled to source/drain regions 702 on both sides of a gate region 706 of the fins 502. The folded fingers 700 are coupled by vias 708 to a metal rail 710 that receives the supply voltage VDD. In this manner, the folded fingers 700 couple the supply voltage VDD to the N-well 404 in parallel through the N-ties 704. The N-type well tap 524 provides the supply voltage bilaterally (i.e., to areas of the N-well 404 on both sides of the well tap cells 400 in FIG. 5).

Figure 8:
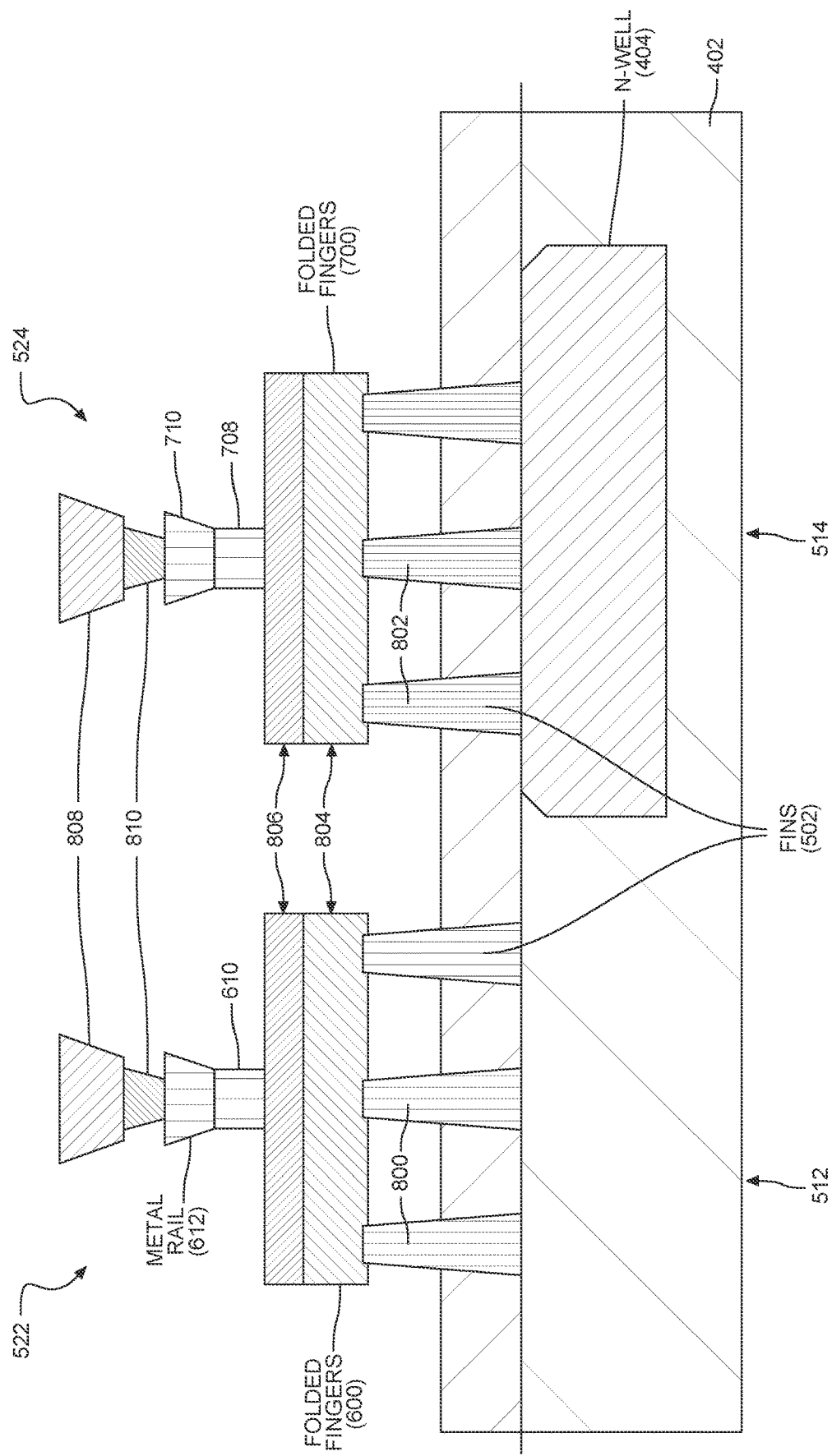
FIG. 8 is an illustration of a cross-sectional end view of fins in which P-ties and N-ties are formed in a well tap cell.
Figure 9:
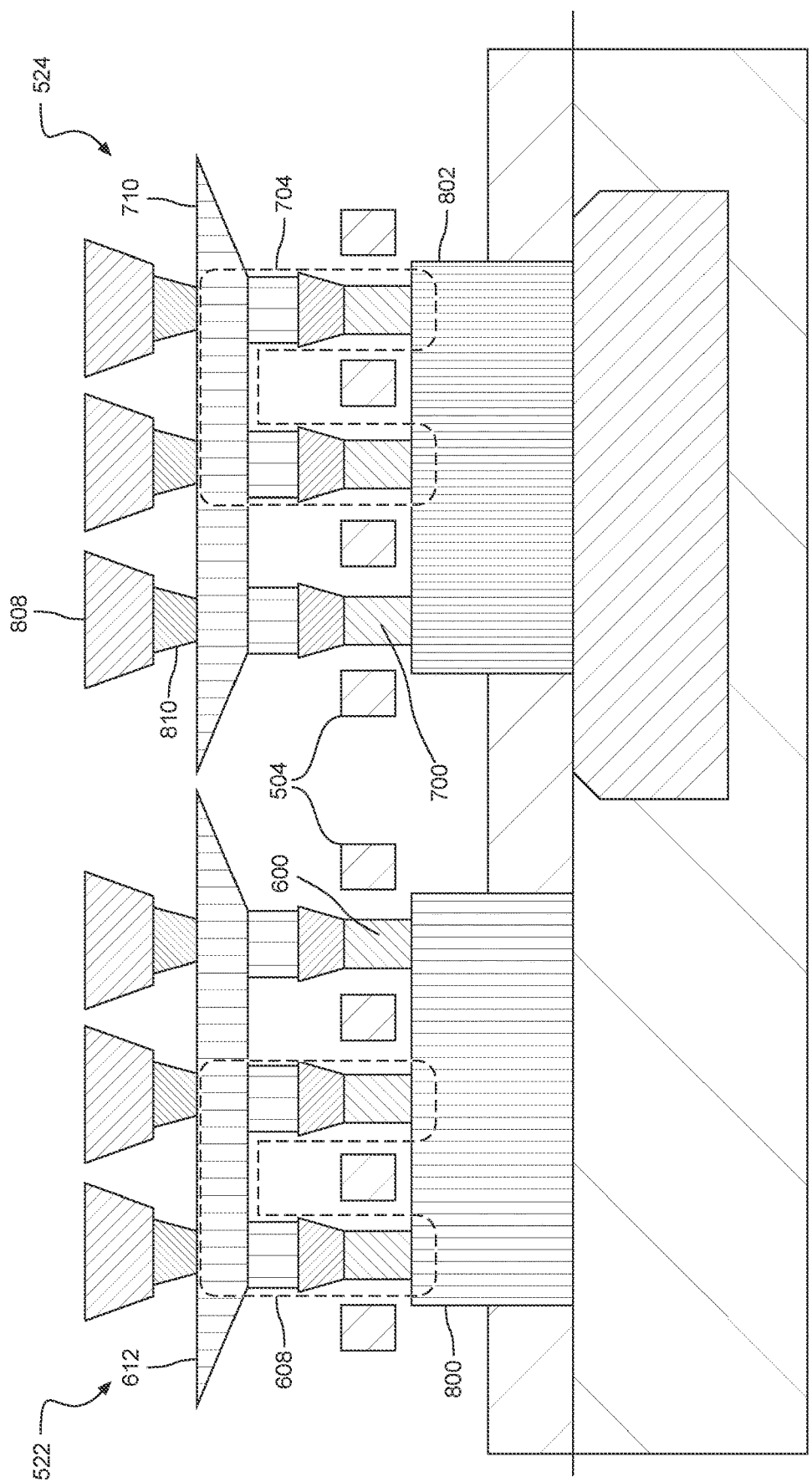
FIG. 9 is an illustration of a cross-sectional side view of fins in which P-ties and N-ties are formed in a well tap cell.

Detailed views of the bilateral P-type well tap 522 and the N-type well tap 524 are shown in greater detail in FIGS. 8 and 9, respectively. Features in FIGS. 8 and 9 that are also shown in FIGS. 4-7 have the same labels as in FIGS. 4-7.

FIG. 8 is an illustration of a cross-sectional end view of fins 800 on the P-type substrate 402 in the P-type implant region 512 and fins 802 on the N-well 404 in the N-type implant region 514. The fins 800 and 802 correspond to the fins 502 in FIGS. 5-7. FIG. 8 shows a side view of one of the folded fingers 600 of FIG. 6 coupled to the fins 800 and a side view of one of the folded fingers 700 of FIG. 7 coupled to the fins 802. The folded fingers 600 and 700 are formed of metal layers 804 and 806. FIG. 8 also shows the vias 610 coupling the folded fingers 600 to the metal rail 612 and the vias 708 coupling the folded fingers 700 to the metal rail 710. In FIG. 8, the metal rails 612 and 710 are further coupled to an upper metal layer 808 by vias 810.

FIG. 9 is an illustration of a cross-sectional side view of the fins 800 in FIG. 8 that form the P-ties 608 in P-type well taps 522 and the fins 802 on the N-well 404 that form the N-ties 704 in the N-type well taps 524. FIG. 9 shows end views of the gates 504 and the folded fingers 600 and 700 coupled to the metal rails 612 and 710, respectively, and the vias 806 coupling to the upper metal layer 804. P-ties 608 are formed where the metal rail 612 couples to the source/drain region 602 on both sides of a gate region 604 and N-ties 704 are formed where the metal rail 710 couples to the source/drain region 702 on both sides of a gate region 706.

Figure 10:
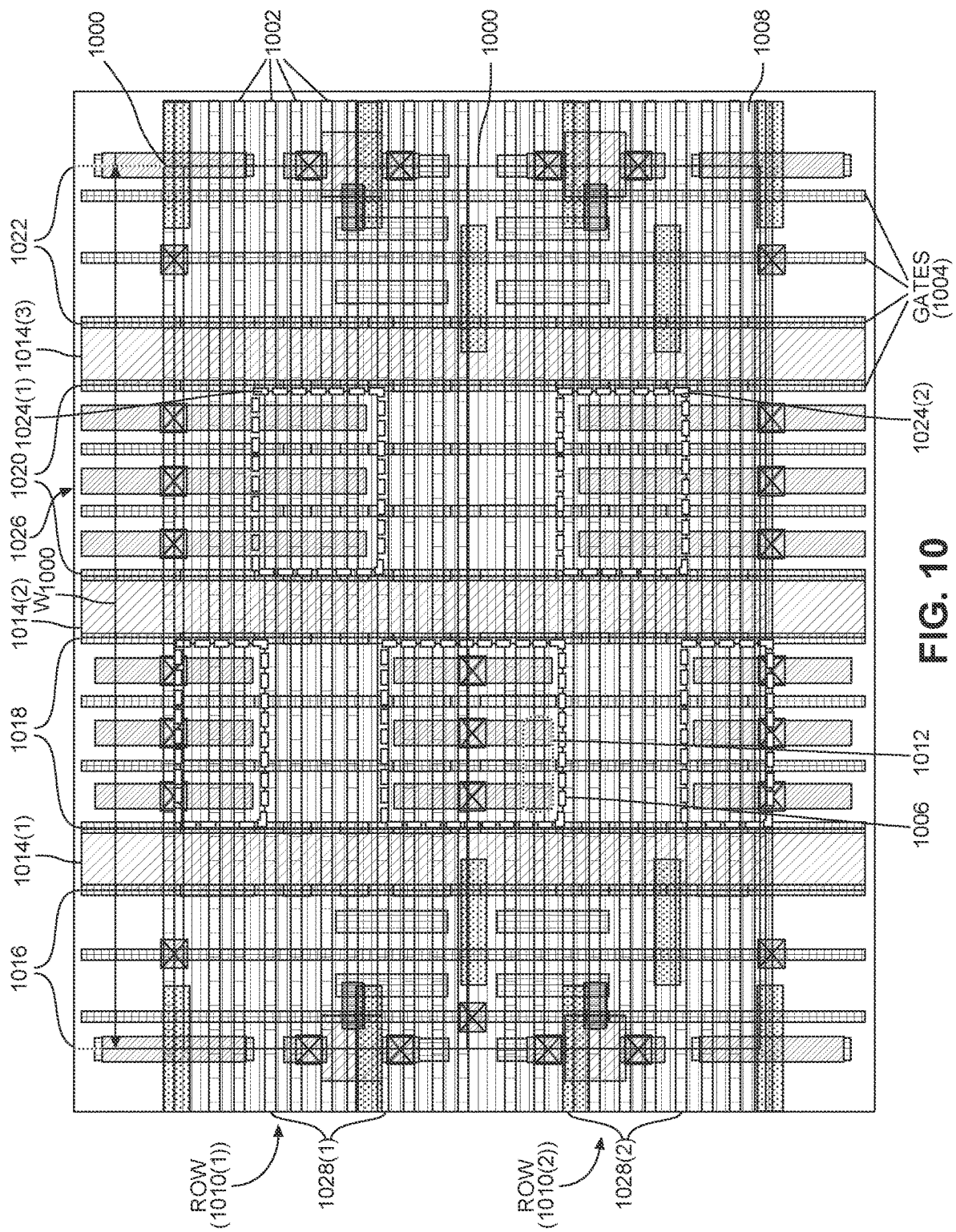
FIG. 10 is a top view illustration of another exemplary well tap cell in an SRAM array circuit in which a bilateral P-type well tap disposed in a horizontal P-type substrate provides ground voltage to the P-type substrate on both sides of the column of well tap cells in parallel.

FIG. 10 illustrates a well tap cell 1000 with a level of detail corresponding to the illustration of well tap cell 400 in FIG. 5. Exemplary aspects of the well tap cell 1000 correspond to those of the well tap cell 400 discussed above. FIG. 10 shows fins 1002 extending in the X-axis direction and gates 1004 extending in the Y-axis direction separated at a gate pitch $P_{GATE}$. A bilateral P-type well taps 1006 provides the ground voltage VSS to the P-type substrate 1008 on both sides of the well tap cells 1000 in parallel. Each bilateral P-type well tap 1006 is disposed partially within a first well tap cell 1000 in a first row 1010(1) and partially within a second well tap cell 1000 in a second row 1010(2). However, each of the P-type well taps 1006 include eight (8) P-ties 1012 rather than the four (4) P-ties 608 of the bilateral P-type well taps 522. The well tap cells 1000 include fin cuts 1014(1)-1014(3) separating sections 1016, 1018, 1020, and 1022, which correspond to the sections 510, 512, 514, and 516, respectively, of the well tap cells 400. Like the width $W_{400}$ of the well tap cells 400, a width $W_{1000}$ of the well tap cells 1000 is equal to fourteen (14) times the gate pitch $P_{GATE}$. The well tap cell 1000 in FIG. 10 includes an N-type well tap 1024(1) disposed in an N-type implant region 1026 in an N-well 1028(1) in the first row 1010(1) and another N-type well tap 1024(2) disposed in the N-type implant region 1026 in the N-well 1028(2) in the second row 1010(2). The N-type implant region 1026 is disposed in the section 1020 of the well tap cell 1000. The N-type well taps 1024(1) and 1024(2) correspond to the N-type well taps 524 in FIG. 5.

Figure 11:
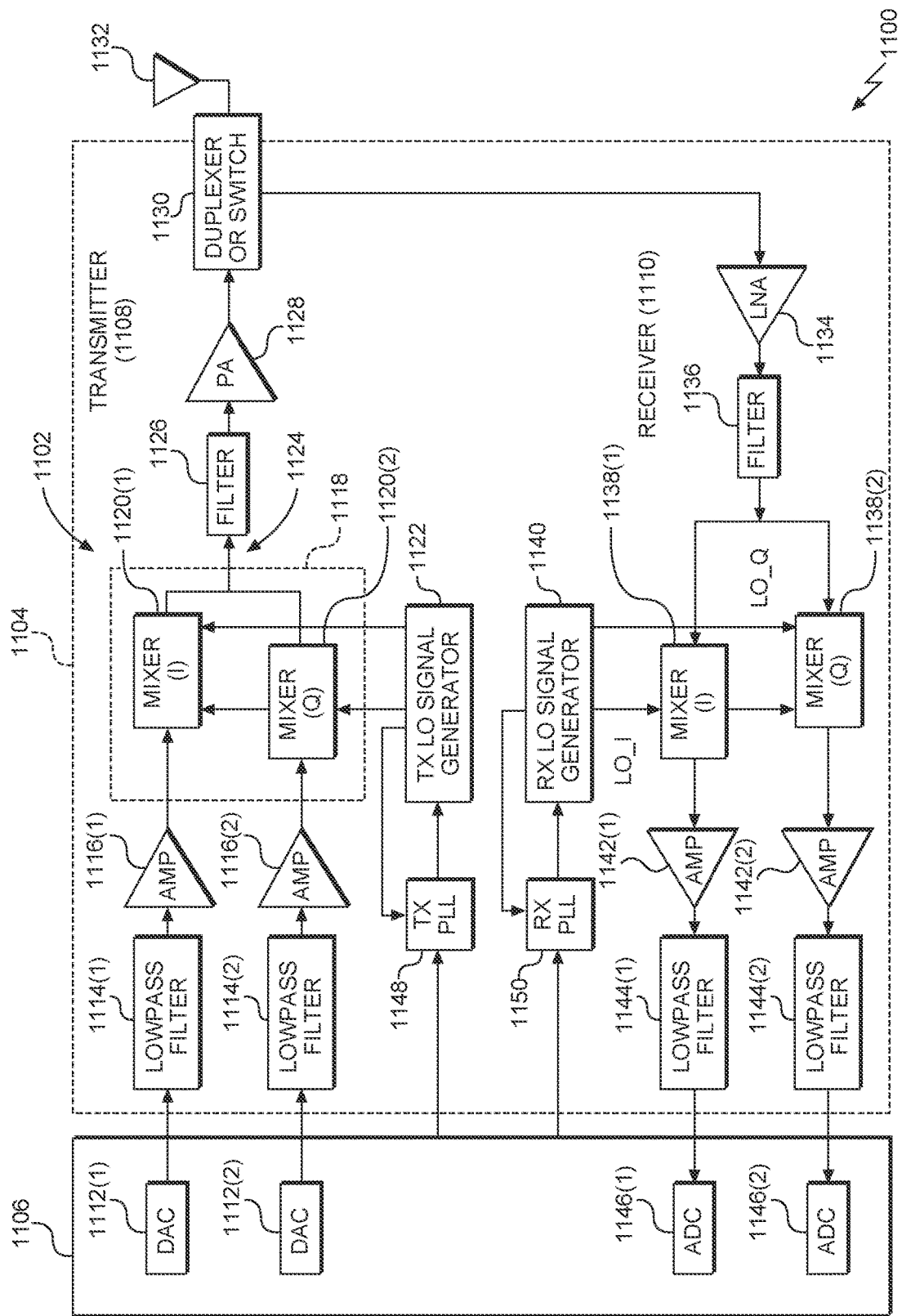
FIG. 11 is a block diagram of an exemplary wireless communications device that includes a radio frequency (RF) module including the SRAM arrays including the well tap cells in FIGS. 4, 5 and 10.

FIG. 11 illustrates an exemplary wireless communications device 1100 that includes radio frequency (RF) components formed from one or more integrated circuits (ICs) 1102, wherein any of the ICs 1102 can include exemplary SRAM array circuits in which a P-type well tap between horizontal N-wells provides ground voltage VSS to a P-type substrate on both sides of a column of the well tap cells to reduce latch-up, as illustrated in FIGS. 4, 5, and 10, and according to any of the aspects disclosed herein. The wireless communications device 1100 may include or be provided in any of the above-referenced devices, as examples. As shown in FIG. 11, the wireless communications device 1100 includes a transceiver 1104 and a data processor 1106. The data processor 1106 may include a memory to store data and program codes. The transceiver 1104 includes a transmitter 1108 and a receiver 1110 that support bi-directional communications. In general, the wireless communications device 1100 may include any number of transmitters 1108 and/or receivers 1110 for any number of communication systems and frequency bands. All or a portion of the transceiver 1104 may be implemented on one or more analog ICs, RFICs, mixed-signal ICs, etc.

The transmitter 1108 or the receiver 1110 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 1100 in FIG. 11, the transmitter 1108 and the receiver 1110 are implemented with the direct-conversion architecture.

In the transmit path, the data processor 1106 processes data to be transmitted and provides I and Q analog output signals to the transmitter 1108. In the exemplary wireless communications device 1100, the data processor 1106 includes digital-to-analog converters (DACs) 1112(1), 1112(2) for converting digital signals generated by the data processor 1106 into the I and Q analog output signals, e.g., I and Q output currents, for further processing.

Within the transmitter 1108, lowpass filters 1114(1), 1114(2) filter the I and Q analog output signals, respectively, to remove undesired signals caused by the prior digital-to-analog conversion. Amplifiers (AMPs) 1116(1), 1116(2) amplify the signals from the lowpass filters 1114(1), 1114(2), respectively, and provide I and Q baseband signals. An upconverter 1118 upconverts the I and Q baseband signals with I and Q transmit (TX) local oscillator (LO) signals from a TX LO signal generator 1122 through mixers 1120(1), 1120(2) to provide an upconverted signal 1124. A filter 1126 filters the upconverted signal 1124 to remove undesired signals caused by the frequency upconversion as well as noise in a receive frequency band. A power amplifier (PA) 1128 amplifies the upconverted signal 1124 from the filter 1126 to obtain the desired output power level and provides a transmit RF signal. The transmit RF signal is routed through a duplexer or switch 1130 and transmitted via an antenna 1132.

In the receive path, the antenna 1132 receives signals transmitted by base stations and provides a received RF signal, which is routed through the duplexer or switch 1130 and provided to a low noise amplifier (LNA) 1134. The duplexer or switch 1130 is designed to operate with a specific receive (RX)-to-TX duplexer frequency separation, such that RX signals are isolated from TX signals. The received RF signal is amplified by the LNA 1134 and filtered by a filter 1136 to obtain a desired RF input signal. Down-conversion mixers 1138(1), 1138(2) mix the output of the filter 1136 with I and Q RX LO signals (i.e., LO_I and LO_Q) from an RX LO signal generator 1140 to generate I and Q baseband signals. The I and Q baseband signals are amplified by AMPs 1142(1), 1142(2) and further filtered by lowpass filters 1144(1), 1144(2) to obtain I and Q analog input signals, which are provided to the data processor 1106. In this example, the data processor 1106 includes analog-to-digital converters (ADCs) 1146(1), 1146(2) for converting the analog input signals into digital signals to be further processed by the data processor 1106.

In the wireless communications device 1100 of FIG. 11, the TX LO signal generator 1122 generates the I and Q TX LO signals used for frequency upconversion, while the RX LO signal generator 1140 generates the I and Q RX LO signals used for frequency downconversion. Each LO signal is a periodic signal with a particular fundamental frequency. A TX phase-locked loop (PLL) circuit 1148 receives timing information from the data processor 1106 and generates a control signal used to adjust the frequency and/or phase of the TX LO signals from the TX LO signal generator 1122. Similarly, an RX PLL circuit 1150 receives timing information from the data processor 1106 and generates a control signal used to adjust the frequency and/or phase of the RX LO signals from the RX LO signal generator 1140.

Wireless communications devices 1100 that each include exemplary SRAM arrays in which a P-type well tap between horizontal N-wells provides parallel ground voltage connections to a P-type substrate on both sides of a column of the well tap cells to reduce latch-up, as illustrated in FIGS. 4, 5, and 10, and according to any of the aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 12:
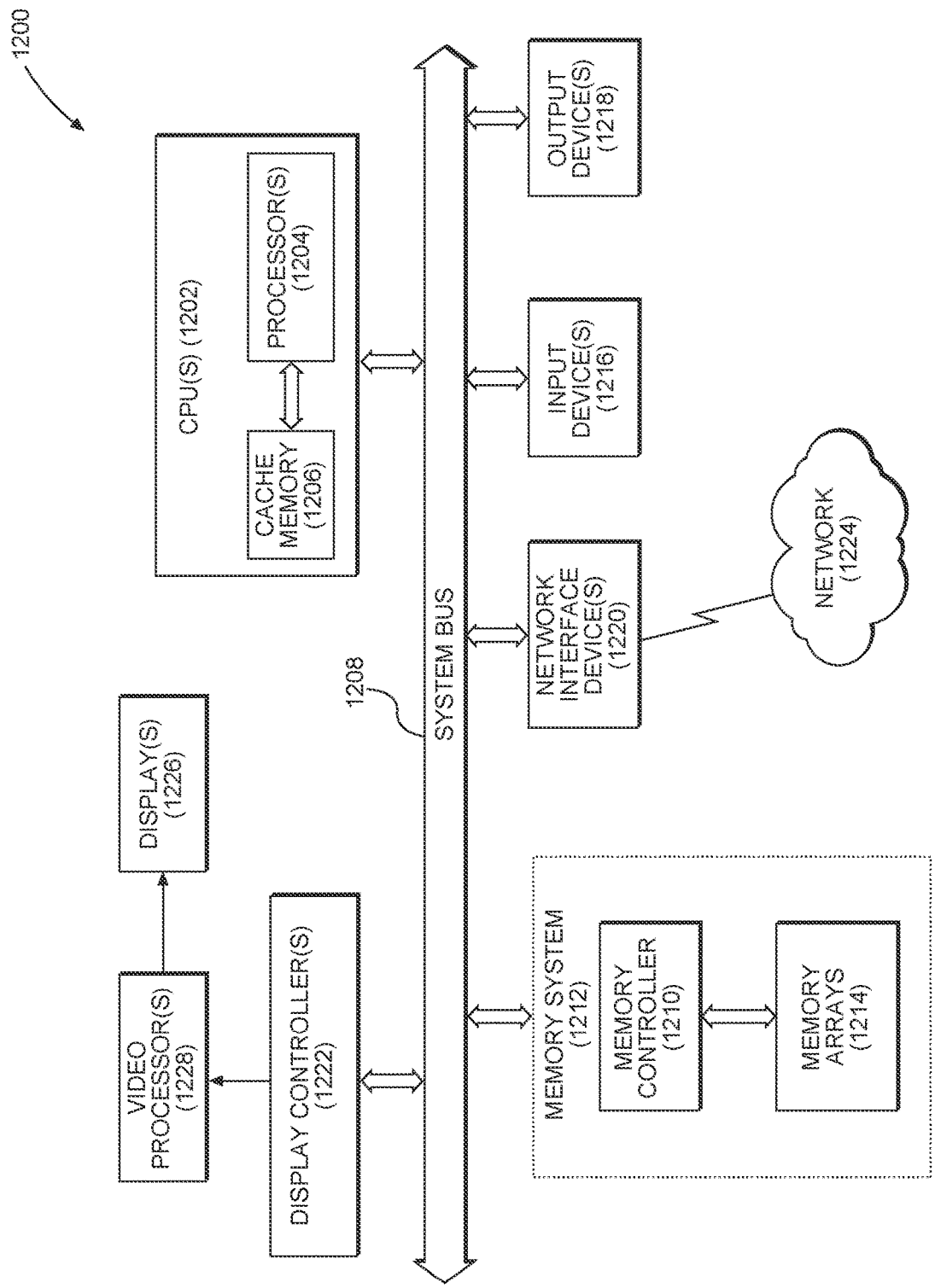
FIG. 12 is a block diagram of an exemplary integrated circuit (IC) package including exemplary SRAM array circuits in which a P-type well tap between horizontal N-wells provides ground voltage VSS to a P-type substrate on both sides of a column of the well tap cells to reduce latch-up, as illustrated in FIGS. 4, 5, and 10, and according to any of the aspects disclosed herein.

In this regard, FIG. 12 illustrates an example of a processor-based system 1200 including SRAM arrays in which a P-type well tap between horizontal N-wells provides parallel ground voltage connections to a P-type substrate on both sides of a column of the well tap cells to reduce latch-up, as illustrated in FIGS. 4, 5, and 10, and according to any aspects disclosed herein. In this example, the processor-based system 1200 includes one or more central processor units (CPUs) 1202, which may also be referred to as CPU or processor cores, each including one or more processors 1204. The CPU(s) 1202 may have cache memory 1206 coupled to the processor(s) 1204 for rapid access to temporarily stored data. As an example, the processor(s)

1204 could include exemplary SRAM array circuits in which a P-type well tap between horizontal N-wells provides ground voltage VSS to a P-type substrate on both sides of a column of the well tap cells to reduce latch-up, as illustrated in FIGS. 4, 5, and 10, and according to any aspects disclosed herein. The CPU(s) 1202 is coupled to a system bus 1208 and can intercouple master and slave devices included in the processor-based system 1200. As is well known, the CPU(s) 1202 communicates with these other devices by exchanging address, control, and data information over the system bus 1208. For example, the CPU(s) 1202 can communicate bus transaction requests to a memory controller 1210 as an example of a slave device. Although not illustrated in FIG. 12, multiple system buses 1208 could be provided, wherein each system bus 1208 constitutes a different fabric.

Other master and slave devices can be connected to the system bus 1208. As illustrated in FIG. 12, these devices can include a memory system 1212 that includes the memory controller 1210 and one or more memory arrays 1214, one or more input devices 1216, one or more output devices 1218, one or more network interface devices 1220, and one or more display controllers 1222, as examples. Each of the memory system 1212, the one or more input devices 1216, the one or more output devices 1218, the one or more network interface devices 1220, and the one or more display controllers 1222 can include exemplary SRAM array circuits in which a P-type well tap between horizontal N-wells provides ground voltage VSS to a P-type substrate on both sides of a column of the well tap cells to reduce latch-up, as illustrated in FIGS. 4, 5, and 10, and according to any of the aspects disclosed herein. The input device(s) 1216 can include any type of input device, including, but not limited to, input keys, switches, voice processors, etc. The output device(s) 1218 can include any type of output device, including, but not limited to, audio, video, other visual indicators, etc. The network interface device(s) 1220 can be any device configured to allow exchange of data to and from a network 1224. The network 1224 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1220 can be configured to support any type of communications protocol desired.

The CPU(s) 1202 may also be configured to access the display controller(s) 1222 over the system bus 1208 to control information sent to one or more displays 1226. The display controller(s) 1222 sends information to the display(s) 1226 to be displayed via one or more video processors 1228, which process the information to be displayed into a format suitable for the display(s) 1226. The display(s) 1226 can include any type of display, including, but not limited to, a cathode ray tube (CRT), a liquid crystal display (LCD), a plasma display, a light emitting diode (LED) display, etc. The display controller(s) 1222, display(s) 1226, and/or the video processor(s) 1228 can include an exemplary SRAM array circuits in which a P-type well tap between horizontal N-wells provides ground voltage VSS to a P-type substrate on both sides of a column of the well tap cells to reduce latch-up, as illustrated in FIGS. 4, 5, and 10, and according to any of the aspects disclosed herein.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. A static random-access memory (SRAM) array circuit, comprising:
   a substrate;
   a plurality of rows of SRAM bit cell circuits disposed on the substrate, each of the plurality of rows extending in a first axis direction;
   a plurality of columns of the SRAM bit cell circuits, the plurality of columns extending in a second axis direction orthogonal to the first axis direction; and
   a column of well tap cells disposed between a first column of the plurality of columns and a second column of the plurality of columns, the column of well tap cells comprising a well tap cell disposed in each row of the plurality of rows;
   wherein:
      the substrate comprises a P-type substrate;
      the well tap cell in each row comprises an N-well in the P-type substrate, the N-well extending in the first axis direction;
      the N-well of the well tap cell in a first row of the plurality of rows is separated from the N-well of the well tap cell in a second row of the plurality of rows by the P-type substrate; and
      a P-type well tap is disposed in the P-type substrate between the N-well of the well tap cell in the first row and the N-well of the well tap cell in the second row and provides ground voltage to the SRAM bit cell circuits on a first side of the column of well tap cells and to the SRAM bit cell circuits on a second side of the column of well tap cells.

2. The SRAM array circuit of clause 1, the well tap cell in the first row further comprising an N-type well tap disposed in the N-well of the well tap cell in the first row providing a supply voltage to the SRAM bit cell circuits on the first side of the column of well tap cells and to the SRAM bit cell circuits on the second side of the column of well tap cells.

3. The SRAM array circuit of clause 2, wherein each well tap cell further comprises:
   a P-type implant region extending in the second axis direction; and
   an N-type implant region extending in the second axis direction;
   wherein:
      the P-type well tap is disposed in the P-type implant region; and
      the N-type well tap is disposed in the N-type implant region.

4. The SRAM array circuit of any of clauses 2 and 3, wherein the P-type well tap comprises:
   a plurality of P-ties on the P-type substrate, each P-tie comprising a first source/drain region on a first side of a gate region and a second source/drain region on a second side of the gate region, the first source/drain region electrically coupled to the second source/drain region.

5. The SRAM array circuit of clause 4, wherein the first source/drain region, the second source/drain region, and the gate region in each of the plurality of P-ties comprise regions of a fin on the P-type substrate.

6. The SRAM array circuit of any of clauses 4 and 5, wherein the P-type well tap further comprises:
   a first finger comprising a first portion of a first metal layer coupled to the first source/drain regions of a first plurality of P-ties;
   a second finger comprising a second portion of the first metal layer coupled to the second source/drain regions of the first plurality of P-ties; and
   a second metal layer electrically coupled to the first finger and the second finger.

7. The SRAM array circuit of clause 6, wherein the P-type well tap further comprises:
   a third finger comprising a third portion of the first metal layer;
   the second source/drain regions of the first plurality of P-ties comprise the first source/drain regions of a second plurality of P-ties; and
   the third finger is coupled to the second source/drain regions of the second plurality of P-ties.

8. The SRAM array circuit of any of clauses 4 to 7, wherein the P-type well tap comprises eight (8) P-ties.

9. The SRAM array circuit of any of clauses 4 to 7, wherein the P-type well tap comprises sixteen (16) P-ties.

10. The SRAM array circuit of any of clauses 4 to 9, wherein the N-type well tap of the well tap cell in the first row comprises:
    a plurality of N-ties on the N-well, each N-tie comprising a first source/drain region on a first side of a gate region and a second source/drain region on a second side of the gate region, the first source/drain region electrically coupled to the second source/drain region.

11. The SRAM array circuit of clause 10, wherein the N-type well tap comprises eight (8) N-ties.

12. The SRAM array circuit of any of clauses 3 to 11, each well tap cell further comprising:
    fins extending in the first axis direction;
    a middle fin cut extending in the second axis direction, the middle fin cut comprising a fin gap between the fins in the P-type implant region and the fins in the N-type implant region.

13. The SRAM array circuit of clause 12, each well tap cell further comprising:
    a first side bit cell termination between the first column of the plurality of columns of the SRAM bit cell circuits and the P-type implant region;
    a first side fin cut between the first side bit cell termination and the P-type implant region, the first side fin cut comprising a fin gap between the fins in the first side bit cell termination and the fins in the P-type implant region;
    a second side bit cell termination between the second column of the plurality of columns of the SRAM bit cell circuits and the N-type implant region; and
    a second side fin cut between the second side bit cell termination and the N-type implant region, the second side fin cut comprising a fin gap between the fins in the second side bit cell termination and the fins in the N-type implant region.

14. The SRAM array circuit of any of clauses 12 and 13, further comprising gates extending above the fins in the second axis direction and spaced apart at a gate pitch in the first axis direction;
   wherein;
      the column of well tap cells is between a first SRAM bit cell circuit in the first column of the plurality of columns and a second SRAM bit cell circuit in the second column of the plurality of columns; and
      a width of the column of well tap cells is equal to fourteen (14) times the gate pitch in the first axis direction.

15. The SRAM array circuit of any of clauses 1 to 14, integrated into a radio-frequency (RF) front end module.

16. The SRAM array circuit of any of clauses 1 to 14 integrated into a device selected from the group consisting of a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

17. An integrated circuit (IC) comprising a static random-access memory (SRAM) array circuit, the SRAM array circuit comprising:
   a substrate;
   a plurality of rows of SRAM bit cell circuits disposed on the substrate, each of the plurality of rows extending in a first axis direction;
   a plurality of columns of the SRAM bit cell circuits, the plurality of columns extending in a second axis direction orthogonal to the first axis direction; and
   a column of well tap cells disposed between a first column of the plurality of columns and a second column of the plurality of columns, the column of well tap cells comprising a well tap cell disposed in each row of the plurality of rows;
   wherein:
      the substrate comprises a P-type substrate;
      the well tap cell in each row comprises an N-well in the P-type substrate, the N-well extending in the first axis direction;
      the N-well of the well tap cell in a first row of the plurality of rows is separated from the N-well of the well tap cell in a second row of the plurality of rows by the P-type substrate; and
      a P-type well tap is disposed in the P-type substrate between the N-well of the well tap cell in the first row and the N-well of the well tap cell in the second row and provides ground voltage to the SRAM bit cell circuits on a first side of the column of well tap cells and to the SRAM bit cell circuits on a second side of the column of well tap cells.

18. The IC of clause 17, the well tap cell in the first row further comprising an N-type well tap disposed in the N-well of the well tap cell in the first row providing a supply voltage to the SRAM bit cell circuits on the first side of the column of well tap cells and to the SRAM bit cell circuits on the second side of the column of well tap cells.

19. The IC of clause 18, each well tap cell further comprising:
   a P-type implant region extending in the second axis direction; and
   an N-type implant region extending in the second axis direction;
   wherein:
      the P-type well tap is disposed in the P-type implant region; and
      the N-type well tap is disposed in the N-type implant region.

20. The IC of any of clauses 17 to 19, the SRAM array circuit further comprising gates extending above fins in the second axis direction and spaced apart at a gate pitch in the first axis direction;
   wherein:
      the column of well tap cells is between a first SRAM bit cell circuit in the first column of the plurality of columns and a second SRAM bit cell circuit in the second column of the plurality of columns; and
      a width of the column of well tap cells is equal to fourteen (14) times the gate pitch in the first axis direction.

What is claimed is:

1. A static random-access memory (SRAM) array circuit, comprising:
   a substrate;
   a plurality of rows of SRAM bit cell circuits disposed on the substrate, each of the plurality of rows extending in a first axis direction;
   a plurality of columns of the SRAM bit cell circuits, the plurality of columns extending in a second axis direction orthogonal to the first axis direction; and
   a column of well tap cells disposed between a first column of the plurality of columns and a second column of the plurality of columns, the column of well tap cells comprising a well tap cell disposed in each row of the plurality of rows;
   wherein:
      the substrate comprises a P-type substrate;
      the well tap cell in each row comprises an N-well in the P-type substrate, the N-well extending in the first axis direction;
      the N-well of the well tap cell in a first row of the plurality of rows is separated from the N-well of the well tap cell in a second row of the plurality of rows by the P-type substrate; and
      a P-type well tap is disposed in the P-type substrate between the N-well of the well tap cell in the first row and the N-well of the well tap cell in the second row and provides ground voltage to the SRAM bit cell circuits on a first side of the column of well tap cells and to the SRAM bit cell circuits on a second side of the column of well tap cells.

2. The SRAM array circuit of claim 1, the well tap cell in the first row further comprising an N-type well tap disposed in the N-well of the well tap cell in the first row providing a supply voltage to the SRAM bit cell circuits on the first side of the column of well tap cells and to the SRAM bit cell circuits on the second side of the column of well tap cells.

3. The SRAM array circuit of claim 2, wherein each well tap cell further comprises:
   a P-type implant region extending in the second axis direction; and
   an N-type implant region extending in the second axis direction;
   wherein:

the P-type well tap is disposed in the P-type implant region; and the N-type well tap is disposed in the N-type implant region.

4. The SRAM array circuit of claim 2, wherein the P-type well tap comprises:

a plurality of P-ties on the P-type substrate, each P-tie comprising a first source/drain region on a first side of a gate region and a second source/drain region on a second side of the gate region, the first source/drain region electrically coupled to the second source/drain region.

5. The SRAM array circuit of claim 4, wherein the first source/drain region, the second source/drain region, and the gate region in each of the plurality of P-ties comprise regions of a fin on the P-type substrate.

6. The SRAM array circuit of claim 4, wherein the P-type well tap further comprises:

a first folded finger comprising a first portion of a first metal layer coupled to the first source/drain regions of a first plurality of P-ties;

a second folded finger comprising a second portion of the first metal layer coupled to the second source/drain regions of the first plurality of P-ties; and a second metal layer electrically coupled to the first folded finger and the second folded finger.

7. The SRAM array circuit of claim 6, wherein the P-type well tap further comprises:

a third folded finger comprising a third portion of the first metal layer;

the second source/drain regions of the first plurality of P-ties comprise the first source/drain regions of a second plurality of P-ties; and the third folded finger is coupled to the second source/drain regions of the second plurality of P-ties.

8. The SRAM array circuit of claim 4, wherein the P-type well tap comprises eight (8) P-ties.

9. The SRAM array circuit of claim 4, wherein the P-type well tap comprises sixteen (16) P-ties.

10. The SRAM array circuit of claim 4, wherein the N-type well tap of the well tap cell in the first row comprises:

a plurality of N-ties on the N-well, each N-tie comprising a first source/drain region on a first side of a gate region and a second source/drain region on a second side of the gate region, the first source/drain region electrically coupled to the second source/drain region.

11. The SRAM array circuit of claim 10, wherein the N-type well tap comprises eight (8) N-ties.

12. The SRAM array circuit of claim 3, each well tap cell further comprising:

fins extending in the first axis direction; and a middle fin cut extending in the second axis direction, the middle fin cut comprising a fin gap between the fins in the P-type implant region and the fins in the N-type implant region.

13. The SRAM array circuit of claim 12, each well tap cell further comprising:

a first side bit cell termination between the first column of the plurality of columns of the SRAM bit cell circuits and the P-type implant region;

a first side fin cut between the first side bit cell termination and the P-type implant region, the first side fin cut comprising the fins in the first side bit cell termination and the fins in the P-type implant region;

a second side bit cell termination between the second column of the plurality of columns of the SRAM bit cell circuits and the N-type implant region; and a second side fin cut between the second side bit cell termination and the N-type implant region, the second side fin cut comprising a fin gap between the fins in the second side bit cell termination and the fins in the N-type implant region.

14. The SRAM array circuit of claim 12, further comprising gates extending above the fins in the second axis direction and spaced apart at a gate pitch in the first axis direction;

wherein:

the column of well tap cells is between a first SRAM bit cell circuit in the first column of the plurality of columns and a second SRAM bit cell circuit in the second column of the plurality of columns; and a width of the column of well tap cells is equal to fourteen (14) times the gate pitch in the first axis direction.

15. The SRAM array circuit of claim 1, integrated into a radio-frequency (RF) front end module.

16. The SRAM array circuit of claim 1 integrated into a device selected from the group consisting of a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

17. An integrated circuit (IC) comprising a static random-access memory (SRAM) array circuit, the SRAM array circuit comprising:

a substrate;

a plurality of rows of SRAM bit cell circuits disposed on the substrate, each of the plurality of rows extending in a first axis direction;

a plurality of columns of the SRAM bit cell circuits, the plurality of columns extending in a second axis direction orthogonal to the first axis direction; and a column of well tap cells disposed between a first column of the plurality of columns and a second column of the plurality of columns, the column of well tap cells comprising a well tap cell disposed in each row of the plurality of rows;

wherein:

the substrate comprises a P-type substrate;

the well tap cell in each row comprises an N-well in the P-type substrate, the N-well extending in the first axis direction;

the N-well of the well tap cell in a first row of the plurality of rows is separated from the N-well of the well tap cell in a second row of the plurality of rows by the P-type substrate; and a P-type well tap is disposed in the P-type substrate between the N-well of the well tap cell in the first row and the N-well of the well tap cell in the second row and provides ground voltage to the SRAM bit cell circuits on a first side of the column of well tap cells and to the SRAM bit cell circuits on a second side of the column of well tap cells.

18. The IC of claim 17, the well tap cell in the first row further comprising an N-type well tap disposed in the N-well of the well tap cell in the first row providing a supply voltage to the SRAM bit cell circuits on the first side of the column of well tap cells and to the SRAM bit cell circuits on the second side of the column of well tap cells.

19. The IC of claim 18, each well tap cell further comprising:
- a P-type implant region extending in the second axis direction; and
- an N-type implant region extending in the second axis direction;

wherein:
- the P-type well tap is disposed in the P-type implant region; and
- the N-type well tap is disposed in the N-type implant region.

20. The IC of claim 17, the SRAM array circuit further comprising gates extending above fins in the second axis direction and spaced apart at a gate pitch in the first axis direction;

wherein:
- the column of well tap cells is between a first SRAM bit cell circuit in the first column of the plurality of columns and a second SRAM bit cell circuit in the second column of the plurality of columns; and
- a width of the column of well tap cells is equal to fourteen (14) times the gate pitch in the first axis direction.

* * * * *